(12) United States Patent
Dai

(10) Patent No.: US 11,929,137 B2
(45) Date of Patent: Mar. 12, 2024

(54) METHOD FOR TESTING MEMORY

(71) Applicant: CHANGXIN MEMORY TECHNOLOGIES, INC., Hefei (CN)

(72) Inventor: Yangyang Dai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 182 days.

(21) Appl. No.: 17/455,300

(22) Filed: Nov. 17, 2021

(65) Prior Publication Data
US 2022/0075550 A1    Mar. 10, 2022

Related U.S. Application Data

(63) Continuation of application No. PCT/CN2021/079977, filed on Mar. 10, 2021.

(30) Foreign Application Priority Data

Mar. 27, 2020    (CN) .......................... 202010228553.8

(51) Int. Cl.
*G11C 29/56*    (2006.01)
*G06F 3/06*    (2006.01)
*G06F 16/903*    (2019.01)

(52) U.S. Cl.
CPC ...... *G11C 29/56012* (2013.01); *G06F 3/0604* (2013.01); *G06F 3/0653* (2013.01);
(Continued)

(58) Field of Classification Search
CPC .... G06F 3/0653; G06F 3/0604; G06F 3/0673; G06F 16/90335; G11C 29/56008; G11C 29/56012; G11C 7/222; G11C 2207/2254
See application file for complete search history.

(56) References Cited

U.S. PATENT DOCUMENTS 10,115,480 B1    10/2018  Gamini et al.
10,622,044 B2 *   4/2020  Duggal ................ G11C 7/1012
(Continued)

FOREIGN PATENT DOCUMENTS

CN    1851821 A    10/2006
CN    101770815 A    7/2010
(Continued)

OTHER PUBLICATIONS

International Search Report as cited in PCT Application No. PCT/CN2021/079977 dated Jun. 10, 2021, 5 pages.
(Continued)

*Primary Examiner* — Steve N Nguyen
(74) *Attorney, Agent, or Firm* — Cooper Legal Group, LLC

(57) ABSTRACT

The present application provides a method for testing a memory, including the steps of: providing a database, the database including a deviation value between a data strobe signal and a clock signal and a corresponding relationship between the deviation value and a memory parameter; searching the database for a deviation value corresponding to a preset memory parameter when a read command is applied to the memory under the preset memory parameter; acquiring a time value at which an output signal is to be captured according to the deviation value; and capturing the output signal at the time value to perform the testing for the memory.

9 Claims, 5 Drawing Sheets

(52) U.S. Cl.
CPC ...... *G06F 3/0673* (2013.01); *G06F 16/90335* (2019.01); *G11C 29/56008* (2013.01)

(56) References Cited

U.S. PATENT DOCUMENTS

| | | |
|---|---|---|
| 2005/0135167 A1 | 6/2005 | Manabe |
| 2006/0036389 A1* | 2/2006 | Ozora .............. G01R 31/31922 |
| | | 702/108 |
| 2006/0193413 A1 | 8/2006 | Shandilya et al. |
| 2006/0262613 A1 | 11/2006 | Braun et al. |
| 2007/0147167 A1* | 6/2007 | Chu ..................... G11C 7/1051 |
| | | 365/233.16 |
| 2010/0153792 A1 | 6/2010 | Jang |
| 2011/0121814 A1 | 5/2011 | Uematsu |
| 2011/0126062 A1 | 5/2011 | Chiang |
| 2012/0047411 A1 | 2/2012 | Lai |
| 2013/0070544 A1* | 3/2013 | Nishiwaki ........... G11C 11/4096 |
| | | 365/193 |
| 2014/0006886 A1 | 1/2014 | Song |
| 2015/0228358 A1* | 8/2015 | Agata .................. G11C 29/023 |
| | | 714/718 |
| 2016/0124873 A1* | 5/2016 | Xu ........................ G06F 13/161 |
| | | 711/167 |
| 2017/0345489 A1* | 11/2017 | Zeng .................... G11C 29/028 |
| 2020/0073568 A1* | 3/2020 | Chaiken ............... G11C 29/021 |

FOREIGN PATENT DOCUMENTS

| | | |
|---|---|---|
| CN | 106297889 A | 1/2017 |
| CN | 108231110 A | 6/2018 |
| CN | 108922570 A | 11/2018 |
| CN | 110800060 A | 2/2020 |
| KR | 100606244 B1 | 7/2006 |
| WO | 2020009652 A1 | 1/2020 |

OTHER PUBLICATIONS

Written Opinion cited in PCT/CN2021/079977, dated Jun. 10, 2021, 8 pages.
Juseop Park et al., "A Built-In Self Test Compensating Process-Voltage Variation in Data Paths of High Performance DRAMs", <2018 IEEE International Memory Workshop (IMW)>, full text, Jun. 21, 2018, 4 pages.
Notice of Allowance of the Chinese application No. 202010228553. 8, dated Mar. 18, 2022, 8 pages.

* cited by examiner

METHOD FOR TESTING MEMORY

CROSS-REFERENCE TO RELATED APPLICATION(S)

The present application is a continuation application of International Patent Application No. PCT/CN2021/079977, filed on Mar. 10, 2021, which claims priority to Chinese Patent Application No. 202010228553.8, filed with the China National Intellectual Property Administration (CNIPA) on Mar. 27, 2020 and entitled "METHOD FOR TESTING MEMORY". The disclosures of International Patent Application No. PCT/CN2021/079977 and Chinese Patent Application No. 202010228553.8 are incorporated herein by reference in their entireties.

TECHNICAL FIELD

The present application relates to the field of memories, and in particular to a method for testing a memory.

BACKGROUND

Upon testing a memory, the memory can generate a valid data window based on an external clock signal, and a testing device for the memory acquires data for testing.

Some testing devices can automatically track a data strobe signal (DQS) to acquire data for testing, while some testing devices do not have an automatic tracking function. As the parameters such as temperature and voltage change, the data window of the memory will be shifted, the testing devices without the automatic tracking function cannot correctly capture valid data which the shifted data window has, and thus cannot accurately acquire data, which causes an inaccurate testing for the memory.

Therefore, it is an urgent problem to improve accuracy of a testing device without an automatic tracking function.

SUMMARY

The technical problem to be solved by the present application is to provide a method for testing a memory, which can improve accuracy of a testing device without an automatic tracking function.

In order to solve the above-mentioned problem, the present application provides a method for testing a memory, including the steps of: providing a database, the database including a deviation value between a data strobe signal and a clock signal and a corresponding relationship between the deviation value and a memory parameter; searching the database for a deviation value corresponding to a preset memory parameter when a read command is applied to the memory under the preset memory parameter; acquiring a time value at which an output signal is to be captured according to the deviation value; and capturing the output signal at the time value to perform the testing for the memory.

The advantages of the present application lie in that the deviation value between the data strobe signal and the clock signal and the corresponding relationship between the deviation value and the memory parameter are formed into a database, the time value at which the output signal is to be captured may be directly acquired based on the records of the database when testing, and the output signal is captured at the time value to perform the testing for the memory, whereby the testing device without the automatic tracking function can also accurately obtain the testing data.

BRIEF DESCRIPTION OF DRAWINGS

To describe the technical solutions in the embodiments of the present application more clearly, the following briefly introduces the accompanying drawings required for describing the embodiments of the present application. Apparently, the accompanying drawings in the following description show merely some embodiments of the present application, and those of ordinary skill in the art may still derive other drawings from these accompanying drawings without creative efforts.

DESCRIPTION OF EMBODIMENTS

In order to make the objective, technical means and effects of the present application more clearly, the present application will be further elaborated below with reference to the accompanying drawings. It should be understood that the embodiments described here are merely some embodiments, rather than all embodiments, of the present application, are not intended to limit the present application. Based on the embodiments of the present application, all other embodiments derived by those of ordinary skill in the art without creative efforts shall fall within the scope of protection of the present application.

Figure 1:
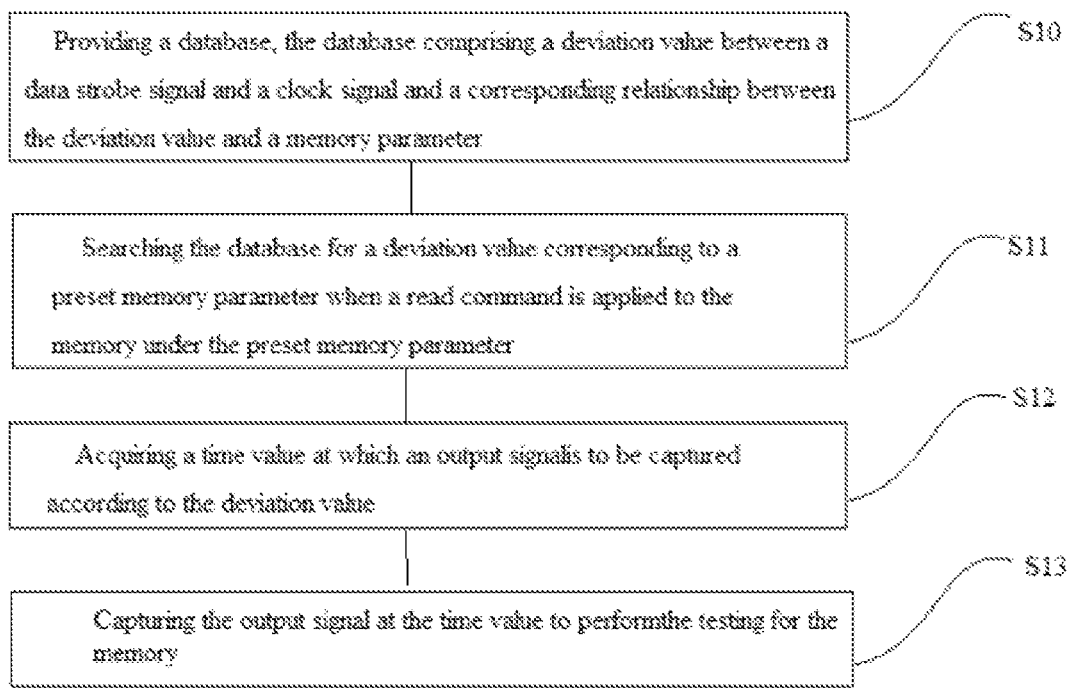
FIG. 1 is a schematic diagram showing the steps in one embodiment of the method for testing a memory according to the present application.

FIG. 1 is a schematic diagram showing the steps in one embodiment of the method for testing a memory according to the present application. With reference to FIG. 1, the method for testing a memory includes the following steps S10, S11, S12 and S13. In step S10, a database is provided, the database includes a deviation value between a data strobe signal and a clock signal and a corresponding relationship between the deviation value and a memory parameter.

The deviation value tDQSCK between the data strobe signal DQS and the clock signal CK is the timing from elapse of the read delay to the actual valid DQS/DQ output, which is a conventional parameter of a semiconductor memory.

The memory parameter refers to a parameter that affects the performance of the memory, which includes at least voltage and temperature.

In this embodiment, a pairing combination of voltage and temperature corresponds to one deviation value between the data strobe signal and the clock signal, in the database. For example, if voltages V1, V2, and temperatures T1, T2 are stored in the database, voltage V1 and temperature T1 correspond to tDQSCK-1, voltage V2 and temperature T1 correspond to tDQSCK-1, voltage V1 and temperature T2 correspond to tDQSCK-3, and voltage V2 and temperature T2 correspond to tDQSCK-3. The above only lists the case that two voltages and two temperatures are included. In actual use, the number of voltage and temperature in the database may be set according to the voltage requirements of the memory itself and the environment.

The database may be stored in a firmware of a testing device in the form of a lookup table.

In step S11, the database is searched for a deviation value corresponding to a preset memory parameter when a read command is applied to the memory under the preset memory parameter.

For example, if a read command is applied to the memory under voltage V1 and temperature T1, the database is searched for the deviation value tDQSCK corresponding to the combination of voltage V1 and temperature T1.

In step S12, a time value at which an output signal is to be captured is acquired according to the deviation value.

In this step, the sum of the deviation value and the time value at which the read delay elapses is taken as the time value at which the output signal is to be captured. That is, the time value is determined to determine the time when data is captured based on the data strobe signal.

In step S13, the output signal is captured at the time value to perform the testing for the memory.

With respect to the method for testing a memory according to the present application, the deviation value between the data strobe signal and the clock signal is stored in the database, and the time value at which the output signal is to be captured is acquired according to the deviation value, and thus the valid data which the shifted data window has can be captured, in order to perform the testing for the memory. In the present application, it is not necessary to track the data strobe signal to realize the testing for the memory device, which greatly improves the testing accuracy of the testing device without the automatic tracking function.

Furthermore, the present application further provides a method for forming the database. The method for forming the database is realized based on applying a read command to the memory.

Figure 2:
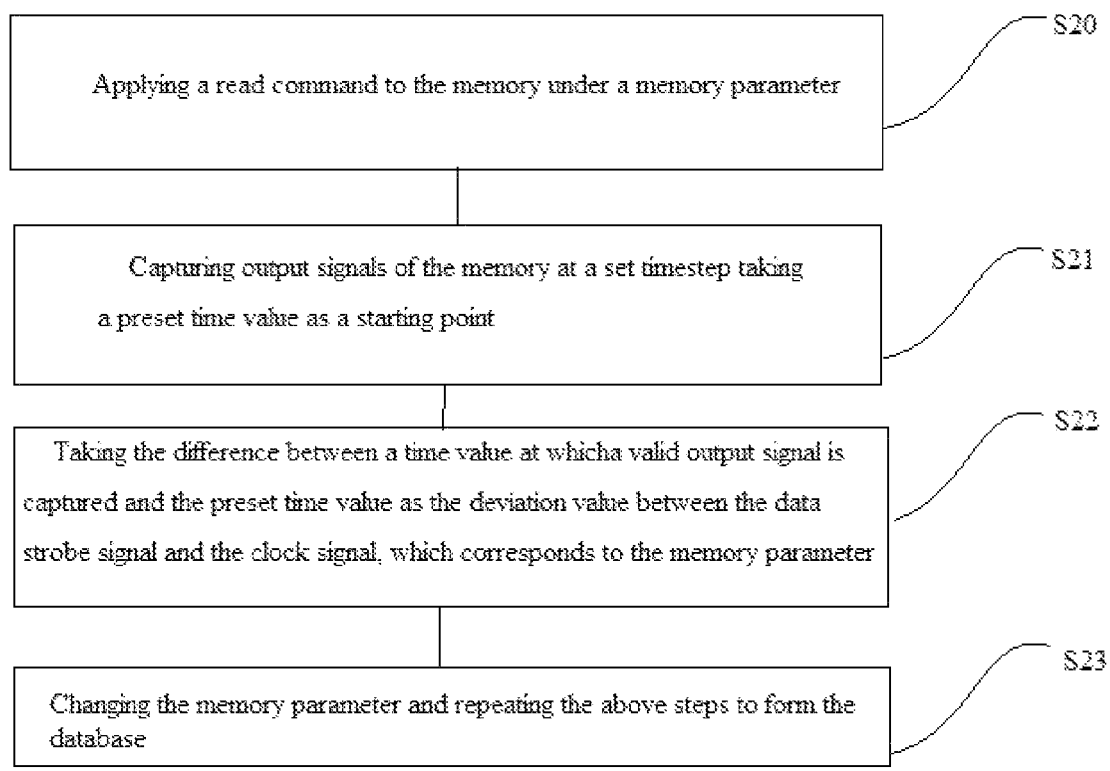
FIG. 2 is a schematic diagram showing the steps of forming a database according to the present application.
Figure 3:
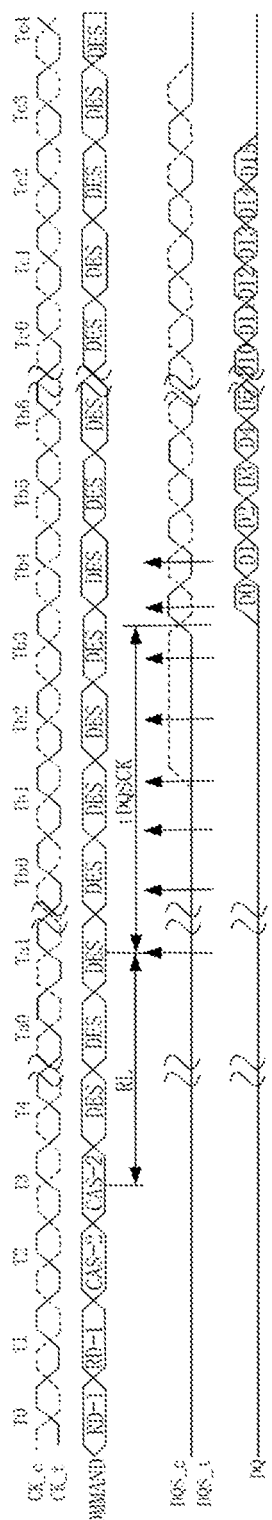
FIG. 3 is a timing diagram after a read command is applied to a memory device according to the present application.

FIG. 2 is a schematic diagram showing the steps of forming a database, and FIG. 3 is a timing diagram after a read command is applied to a memory device. With reference to FIGS. 2 and 3, the method for forming the database includes the following steps S20, S21, S22 and S23.

In step S20, a read command is applied to a memory under a memory parameter.

For example, a read command is applied to a memory under voltage V1 and temperature T1.

In step S21, a plurality of output signals of the memory is captured at a set timestep taking a preset time value as a starting point.

Specifically, in this embodiment, the output signals of the memory is captured at a set timestep taking the time value RL at which the read delay elapses as the starting point, and the positions at which the output signals of the memory are captured are indicated by the arrows shown in FIG. 3. That is, the output signals of the memory are captured multiple times by one-time read command. The set timestep may be selected according to actual requirements, such as several nanoseconds or ten and several nanoseconds.

In step S22, the difference between a time value at which a valid output signal is captured and the preset time value is taken as the deviation value between the data strobe signal and the clock signal, which corresponds to the memory parameter.

The output signal captured at different time values may be a valid signal or an invalid signal. Whether the output signal is invalid may be determined by comparing the captured output signal with a testing signal. If the output signal is consistent with the testing signal, it means that the output signal is a valid signal, and if the output signal is inconsistent with the testing signal, it means that the output signal is an invalid signal.

Further, a group of graphs may be provided at a certain time value for the memory as a strobe signal to capture the corresponding output signal. If the number of the valid signals of the output signals corresponding to the group of graphs is above a preset percentage, the output signal at the time value is considered to be a valid signal, and if the number of the valid signals of the output signals corresponding to the group of graphs is below the preset percentage, the output signal at the time value is considered to be an invalid signal.

Further, in order to improve the accuracy of data collection of the database, the setting of the preset time value must meets the following requirements: after the preset time value, the change trend of the output signal may follow an order of: an invalid signal, a valid signal, and an invalid signal. State differently, the output signal captured at the preset time value is an invalid signal, the output signal becomes a valid signal after several preset timesteps have elapsed, and the output signal becomes an invalid signal after several preset timesteps have further elapsed.

Further, capturing the output signal is stopped when the output signal is converted from a valid signal into an invalid signal. In other words, the output signal being converted from a valid signal into an invalid signal is used as a criterion for stopping capturing the output signal. In order to further improve the accuracy of data collection, it is usually necessary to collect a plurality of consecutive output signals which are all valid signals. In this case, capturing the output signal is stopped when the output signal is converted from a valid signal into an invalid signal.

Further, capturing the output signal may also be stopped one clock period after the actual valid DQS/DQ is output. For example, as shown in FIG. 3, the output signal is captured between the clock period Ta1 and the clock period Tb4, and capturing the output signal is stopped before the next valid DQS/DQ is output.

In the case that a plurality of consecutive output signals are all valid signals, determining the deviation value between the data strobe signal and the clock signal which corresponds to the memory parameter may include: taking the difference between a time value a first valid output signal is captured and the preset time value as an initial value; taking the difference between a time value a last valid output signal is captured and the preset time value as an end value; and selecting a value within the time range formed by the initial value and the end value as the deviation value between the data strobe signal and the clock signal, which corresponds to the memory parameter, for example, selecting an intermediate value within the time range formed by the initial value and the final value as the deviation value between the data strobe signal and the clock signal, which corresponds to the memory parameter.

In step S23, the memory parameter is changed and the above steps are repeated to form the database.

For example, the memory parameter is changed to be the combination of voltage V2 and temperature T1, steps S20 to S22 are repeated to acquire the deviation value between the data strobe signal and the clock signal, which corresponds to the memory parameter. By analogy, the database is formed.

Figure 4:
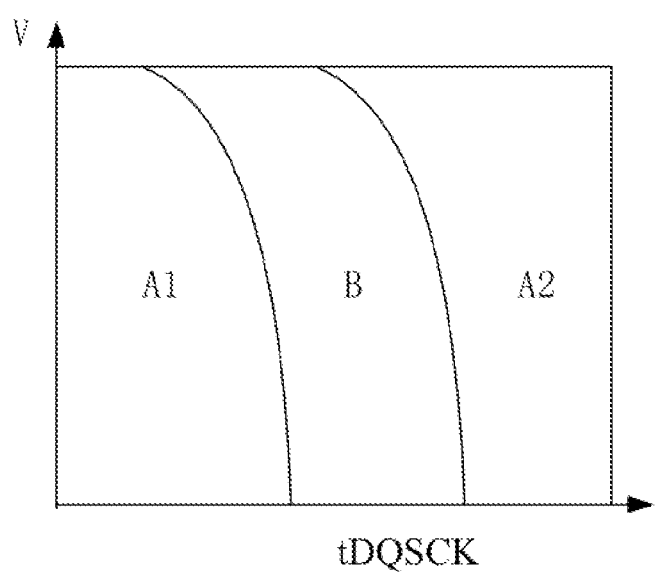
FIG. 4 is a plot showing Shmoo profile for the area of the valid output signals and the area of the invalid output signals as a function of the deviation value under constant temperature and variable voltage.

FIG. 4 is a plot showing Shmoo profile for the area of the valid output signals and the area of the invalid output signals as a function of the deviation value under constant temperature and variable voltage. With reference to FIG. 4, the abscissa is the deviation value, and the ordinate is the voltage, area A1 and area A2 are the areas where the output signals are invalid signals, and area B is the area where the output signals are valid signals. Area B is located between area A1 and area A2. A voltage may be selected, a deviation value in its corresponding B area is selected as the deviation value under this memory parameter; then another voltage is selected, a deviation value in its corresponding B area is selected as the preferred deviation value under this memory parameter, as the preferred deviation value under another memory parameter. By analogy, multiple preferred deviation values are selected, and the multiple preferred deviation values may be stored in the database in the form of a curve.

Figure 5A:
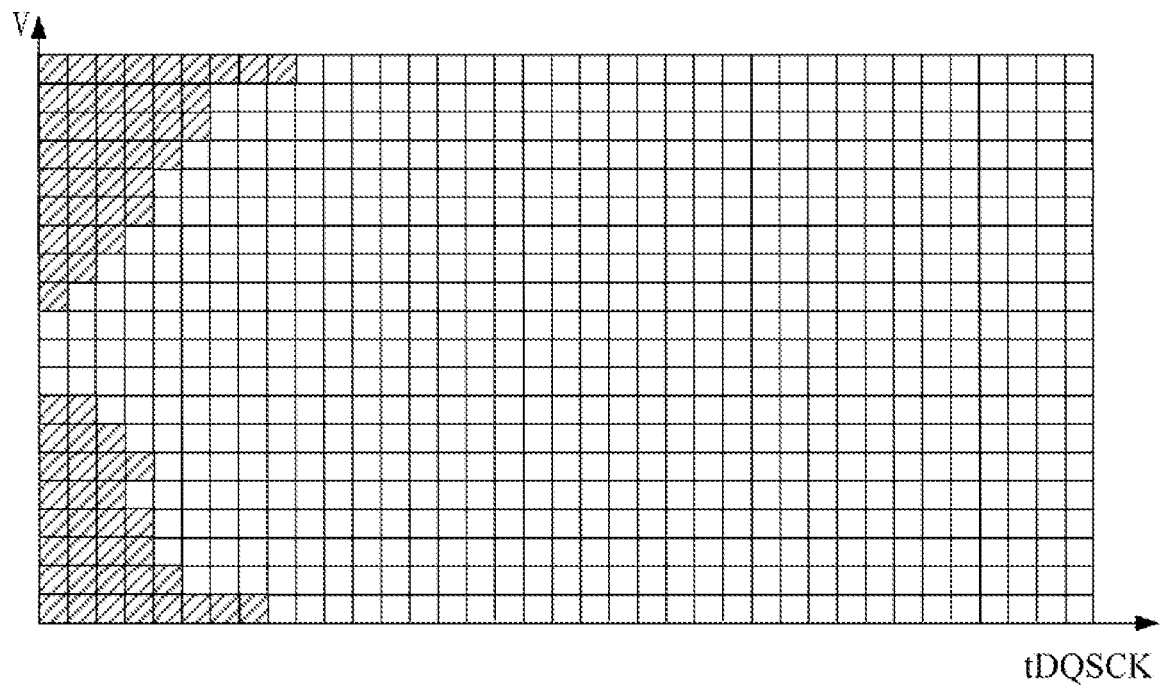
FIG. 5A is a plot showing Shmoo profile for the area of the valid output signals and the area of the invalid output signals as a function of the deviation value tDQSCK under constant temperature and variable voltage, which is obtained by using a testing device without an automatic tracking function.
Figure 5B:
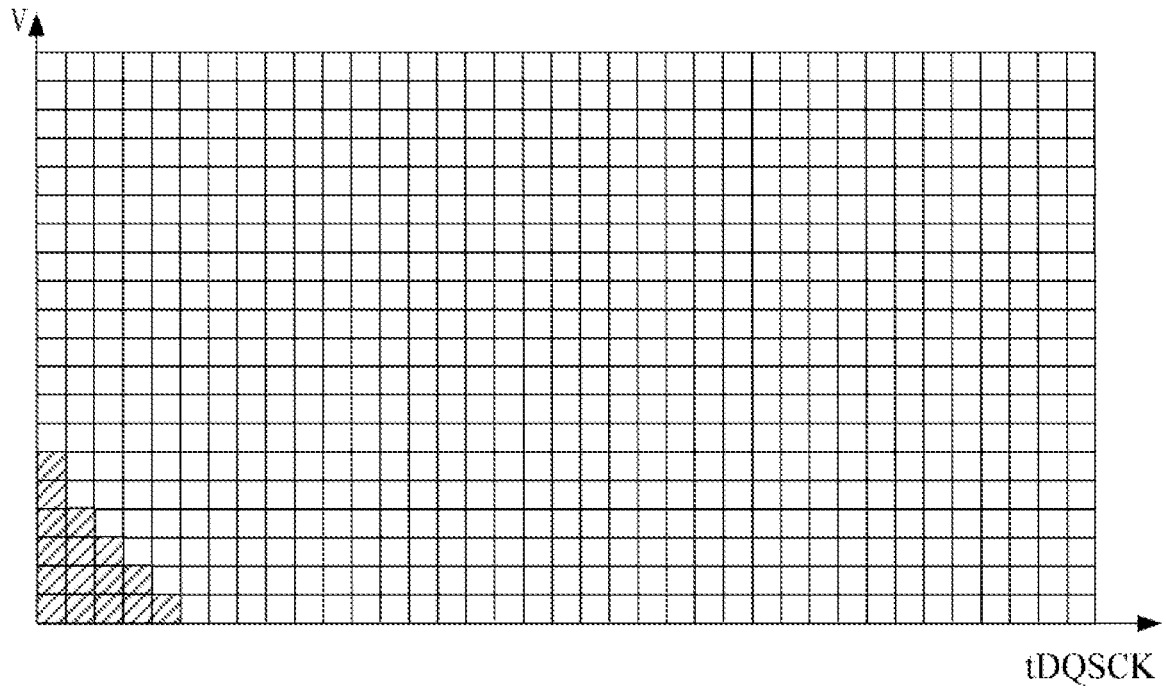
FIG. 5B is a plot showing Shmoo profile for the area of the valid output signals and the area of the invalid output signals as a function of the deviation value tDQSCK under constant temperature and variable voltage, which is obtained by using the testing method of the present application, in which the area of the invalid output signals is expressed by shading.

FIG. 5A is a plot showing Shmoo profile for the area of the valid output signals and the area of the invalid output signals as a function of the deviation value tDQSCK under constant temperature and variable voltage, which is obtained by using a testing device without an automatic tracking function; and FIG. 5B is a plot showing Shmoo profile for the area of the valid output signals and the area of the invalid output signals as a function of the deviation value tDQSCK under constant temperature and variable voltage, which is obtained by using the testing method of the present application, in which the area of the invalid output signals is expressed by shading. With reference to FIGS. 5A and 5B, there are areas of the invalid output signals in the upper left corner and the lower left corner on the Shmoo profile obtained by the testing device without the automatic tracking function. This occurs because the testing device without the automatic tracking function cannot automatically track a signal, and cannot acquire the output signal at the accurate time value, as a result of which the measurement error is large, the truly failed units cannot be detected, and thus the accuracy of testing is low. By means of the Shmoo profile obtained by the testing method of the present application, the accurate time at which the output signal is captured may be obtained by using the database, and the truly failed units can be detected. It can be seen from FIG. 5B that, there is only a small area of the invalid output signals in the lower left corner of the Shmoo profile, but not a large area of the invalid output signals as shown in FIG. 5A.

The foregoing descriptions are only the preferred embodiments of the present application. It should be noted that, several improvements and modifications can be made by those of ordinary skill in the art without departing from the principle of the present application, and these improvements and modifications should also be considered within the scope of protection of the present application.

What is claimed is:

1. A method for testing a memory, comprising the steps of:
providing a database, the database comprising a deviation value between a data strobe signal and a clock signal and a corresponding relationship between the deviation value and a memory parameter;
searching the database for a deviation value corresponding to a preset memory parameter when a read command is applied to the memory under the preset memory parameter;
acquiring a time value at which an output signal is to be captured according to the deviation value corresponding to the preset memory parameter; and
capturing the output signal at the time value to perform the testing for the memory;
wherein providing the database comprises the steps of:
applying a read command to the memory under a memory parameter;
capturing a plurality of output signals of the memory at a set timestep taking a preset time value as a starting point;
taking a difference between a time value at which a valid output signal is captured and the preset time value as the deviation value between the data strobe signal and the clock signal, which corresponds to the memory parameter; and
changing the memory parameter and repeating the above steps to form the database;
wherein the output signal is compared with a testing signal to determine whether the output signal is valid.

2. The method for testing a memory according to claim 1, wherein the memory parameter comprises at least voltage and temperature.

3. The method for testing a memory according to claim 1, wherein the preset time value is a time value at which a read delay elapses.

4. The method for testing a memory according to claim 3, wherein the output signal captured at the preset time value is an invalid signal.

5. The method for testing a memory according to claim 4, wherein capturing the plurality of output signals is stopped when the output signal is converted from the valid output signal into the invalid signal.

6. The method for testing a memory according to claim 4, wherein capturing the plurality of output signals is stopped when the output signal is converted from the valid output signal into the invalid signal, in the case that a plurality of consecutive output signals are all valid signals.

7. The method for testing a memory according to claim 6, wherein a difference between a time value at which a first valid output signal is captured and the preset time value is taken as an initial value, a difference between a time value at which a last valid output signal is captured and the preset time value is taken as an end value, and a value within a time range formed by the initial value and the end value is selected as the deviation value between the data strobe signal and the clock signal, which corresponds to the memory parameter.

8. The method for testing a memory according to claim 1, wherein a change trend of the output signal follows an order of: an invalid signal, a valid signal, and an invalid signal.

9. The method for testing a memory according to claim 1, wherein the step of acquiring the time value at which the output signal is to be captured according to the deviation value corresponding to the preset memory parameter further comprises: taking a sum of the deviation value and the time value at which a read delay elapses as the time value at which the output signal is to be captured.

* * * * *